(12) United States Patent
Lin et al.

(10) Patent No.: US 8,525,296 B1
(45) Date of Patent: Sep. 3, 2013

(54) CAPACITOR STRUCTURE AND METHOD OF FORMING THE SAME

(75) Inventors: Yung-Chang Lin, Taichung (TW); Chien-Li Kuo, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/532,792

(22) Filed: Jun. 26, 2012

(51) Int. Cl.
H01L 21/02 (2006.01)

(52) U.S. Cl.
USPC ........................................................ 257/532

(58) Field of Classification Search
USPC ........................................................ 257/532
See application file for complete search history.

(56) References Cited

U.S. PATENT DOCUMENTS

| | | | |
|---|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Pual Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Estes |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |

(Continued)

*Primary Examiner* — Anthony Ho
(74) *Attorney, Agent, or Firm* — Winston Hsu; Scott Margo

(57) ABSTRACT

The present invention provides a capacitor structure, comprising a substrate, a TSV, a dielectric layer and a doped region. The substrate includes a first surface and a second surface, which are disposed oppositely to each other. The TSV penetrates through the first surface and the second surface. The dielectric layer is disposed in the substrate and encompasses the TSV. The doped region is disposed between the dielectric layer and the substrate. The present invention further provides a method of forming the same.

8 Claims, 5 Drawing Sheets

(56) References Cited

U.S. PATENT DOCUMENTS

| | | |
|---|---|---|
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,732,926 B2 | 6/2010 | Uchiyama |
| 7,846,837 B2 | 12/2010 | Kuo |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0244247 A1 | 9/2010 | Chang |
| 2010/0323478 A1 | 12/2010 | Kuo |
| 2011/0027962 A1 | 2/2011 | Bernstein |

CAPACITOR STRUCTURE AND METHOD OF FORMING THE SAME

BACKGROUND OF THE INVENTION

1. Field of the Invention

The present invention relates to a capacitor structure and a method of forming the same, and more particularly, to a capacitor structure with a TSV and a method of forming the same.

2. Description of the Prior Art

In recent years, as various kinds of consumer electronic products have constantly developed towards miniaturization, the size of semiconductor components has reduced accordingly in order to meet requirements of high integration, high performance, low power consumption, and demands for more polyvalent products.

The electronic products are manufactured through a variety of semiconductor fabricating methods to form electronic components on silicon substrates, such as metal oxide semiconductor (MOS) transistors, capacitors or resistors. The electronic components are connected to each other so as to form complex integrated circuits. In general, a capacitor refers to a structure having a top electrode, a dielectric layer and a bottom electrode. In conventional arts, a capacitor is disposed on an inter-metal dielectric (IMD) layer and contains a "metal-insulator-metal (MIM)" structure. However, since the size of the electronic device is greatly reduced and the space for forming the capacitor is reduced, it is harder to form a capacitor with larger capacitance on silicon substrates.

SUMMARY OF THE INVENTION

The present invention therefore provides a capacitor structure and a method of forming the same. One feature is the integration of conventional TSV structure into the present invention so as to increase the capacitance value of the capacitor structure.

According to one embodiment, the present invention provides a capacitor structure, including a substrate, a TSV, a dielectric layer and a doped region. The substrate includes a first surface and a second surface, which are disposed oppositely to each other. The TSV penetrates through the first surface and the second surface. The dielectric layer is disposed in the substrate and encompasses the TSV. The doped region is disposed between the dielectric layer and the substrate.

According to another embodiment, the present invention further provides a method of forming a capacitor structure. First, a substrate is provided with a first surface and a second surface which are disposed oppositely to each other. Then, a first opening and a second opening are formed on the substrate on the first surface side. A doped region is then formed in the substrate adjacent to the second opening. A liner layer is formed on the surface of the first opening and the second opening. The liner layer in the second opening is then removed. Then, a dielectric layer is formed on the doped region in the second opening. Finally, a conductive layer is formed to completely fill the first opening and the second opening.

The capacitor structure and the forming method thereof are based on a conventional TSV structure. Accordingly, the TSV and the capacitor in the present invention can be formed simultaneously. By using the TSV as the electrode, the area between the electrode and the dielectric layer can be enlarged and the capacitance value can be upgraded as well.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed. The preferred embodiments of the present invention are illustrated in the accompanying drawings with numbered elements.

Figure 1:
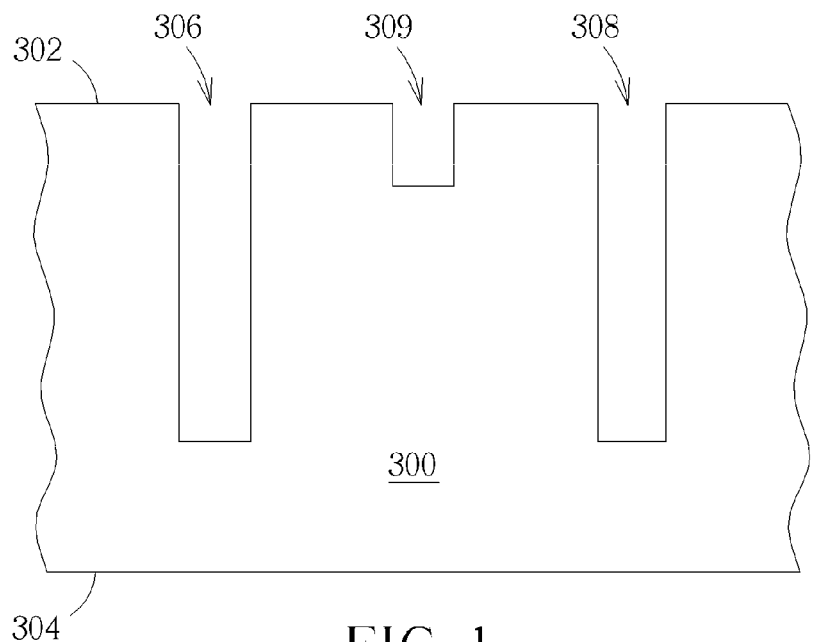
FIG. 1 to FIG. 9 show schematic diagrams of the method of forming the capacitor structure according to one embodiment of the present invention.

Please refer to FIG. 1 to FIG. 9, which show schematic diagrams of the method of forming the capacitor structure according to one embodiment of the present invention. As shown in FIG. 1, a substrate 300 is provided. The substrate 300 may be a silicon substrate, an epitaxial silicon substrate, a silicon germanium substrate, a silicon carbide substrate or a silicon-on-insulator (SOI) substrate. In one embodiment, the substrate 300 has a first conductive type, such as a silicon substrate containing phosphorous atoms ($P^-$). The substrate 300 contains a first surface 302 and a second surface 304, which are disposed oppositely to each other. In one embodiment, the first surface 302 is an active surface of the substrate 300 and the second surface 304 is the backside surface of the substrate 300. The thickness of the substrate 300 is substantially between 700 to 1000 micro meters ($\mu m$), but is not limited thereto. Next, a first opening 306, a second opening 308 and a third opening 309 are formed on the substrate 300 at the side of the first surface 302. The depth and the aperture size of the first opening 306, the second opening 308 and the third opening 309 can be adjusted according to different designs of the device. In one embodiment, the depth of the first opening 306 is substantially equal to that of the second opening 308, and the depth of the third opening 309 is substantially shallower than those of the first opening 306 and the second opening 308. For example, the depths of the first opening 306 and the second opening 308 are 50 to 100 $\mu m$, and the depth of the third opening 309 is 5 $\mu m$. In another embodiment, the depth of the first opening 306 is different from that of the second opening 308. For instance, the depth of the first opening 306 is greater than that of the second opening 308. The forming sequence of the first opening 306, the second opening 308 and the third opening 309 can be adjusted according to different designs of the product. In one embodiment, if the first opening 306 and the second opening 308 have the same depth, they can be formed during the same photolithography-and-etching (PEP) process. For example, the first opening 306 and the second opening 308 are formed in one PEP step, and then the third opening 309 is formed in another PEP step. Alternatively, the third opening 309 can be formed before forming the first opening 306 and the second opening 308. In one embodiment, the mask for forming the third opening 309 can further include a zero mark such that the third opening 309 and an alignment mark (not shown) can be formed simultaneously on the substrate 300. The alignment mark can be used for aligning in a process when forming the first opening 306 and/or the second opening 308, or in the subsequent semiconductor fabricating steps. In another embodiment, the first opening 306, the second opening 308 and the third opening 309 can be formed in one single step. For example, when the first opening 306, the second opening 308 and the third opening 309 have different depths, they can be formed in one single PEP step. In another embodiment, the first opening 306, the second opening 308 and the third opening 309 with different depths can be formed by using a half-tone mask.

Figure 2:
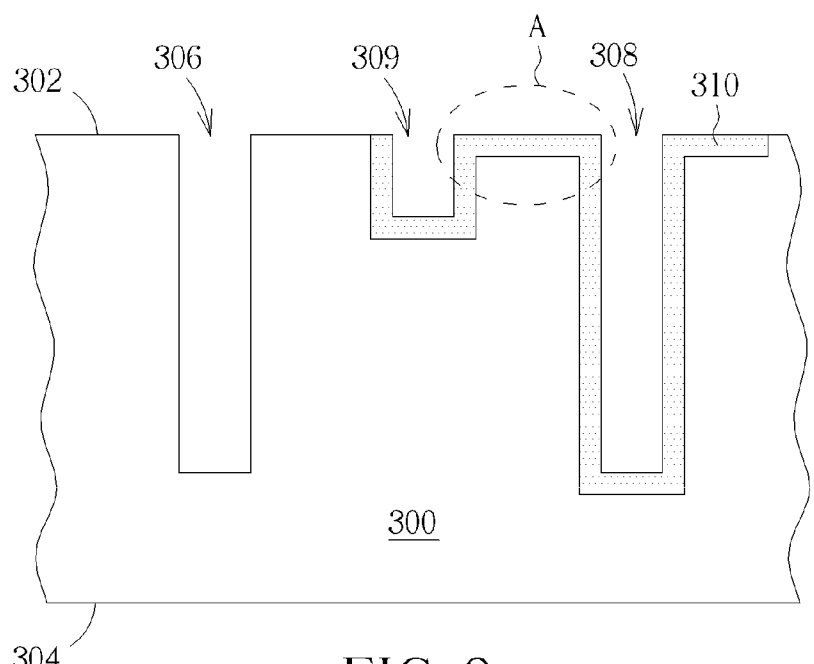

As shown in FIG. 2, a doped region 310 is formed within a specific region on the substrate 300, such as the region adjacent to the second opening 308 and the third opening 309. In one embodiment, the doped region 310 is formed only on the surface of the second opening 308 and the third opening 309, rather than on the surface of the first opening 306. The doped region 310 can be formed through a gas phase doping (GPD) step. For example, a patterned photoresist layer or other types of mask (not shown) can be formed on the substrate 300 to cover the first opening 306. Then, the second opening 308 and the third opening 310 are subjected and exposed to a doping gas, followed by an annealing step. In one embodiment, the doping gas has a second conductive type which is different from the first conductive type. For instance, when the substrate 300 contains P$^-$, the doping gas contains N. It is noted that the doped region 310 is preferably between the second opening 308 and the third opening 309 (area A in FIG. 2) and contiguous to both openings. In another embodiment, the doped region 310 is not yet contiguous to the area A in this step. In another embodiment, the doped region 310 can be fully formed on the substrate 300 so that the doped region 310 can is further formed on the surface of the first opening 306.

Figure 3:
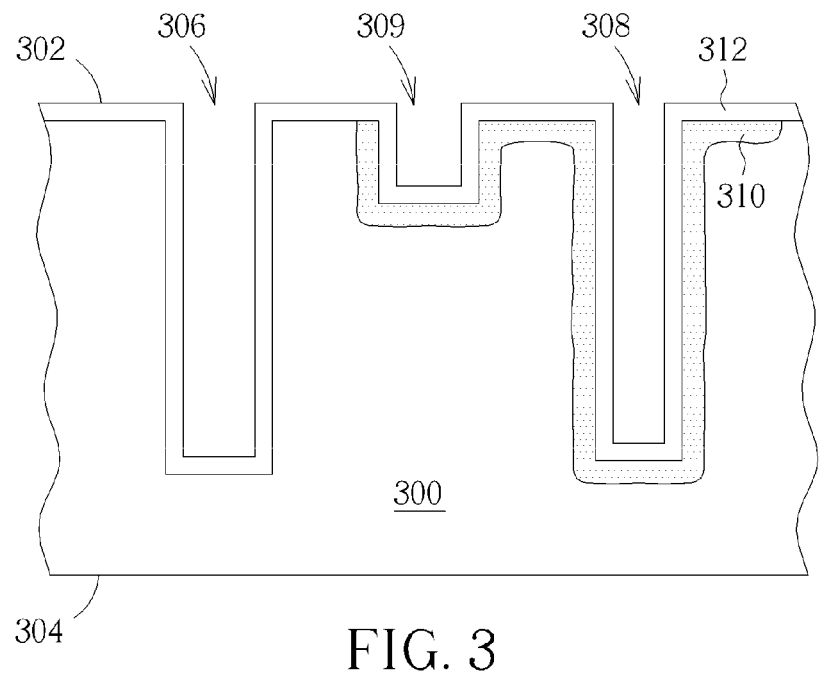

As shown in FIG. 3, a liner layer 312, such as a single oxide layer, a single nitride layer or multi layers with an oxide layer and a nitride layer, is formed on the first surface 302 of the substrate 300. In one embodiment, the liner layer 312 is formed through a thermal oxidation process, so that the liner layer 312 is formed conformally along the first opening 306, the second opening 308 and the third opening 309, and has a thickness of about 2000 angstroms (Å) to 1 μm. In one embodiment, the thermal oxidation process can be incorporated into the annealing process of the GPD process, which means that the liner layer 312 and the doped region 310 are formed simultaneously once the thermal oxidation process has been carried out. In another embodiment, by adjusting the parameters of the thermal oxidation process, the area of the doped region 310 can be enlarged, thereby ensuring that the doped region 310 is contiguous to the region A. In another embodiment, the liner layer 312 can be formed through other processes, such as an atomic layer deposition (ALD) process.

Figure 4:
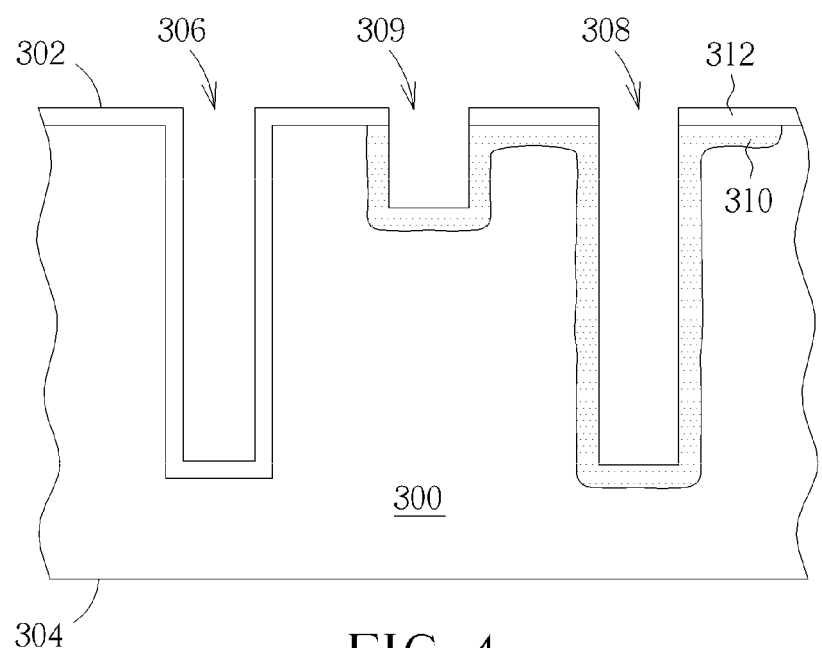

As shown in FIG. 4, the liner layer 312 on the surface of the second opening 308 and the third opening 309 is removed. In one embodiment, by using the alignment mark, a patterned photoresist layer (not shown) is formed to cover the region outside the second opening 308 and the third opening 309, and then a wet etching and/or a dry etching is performed to remove the liner layer 312 not covered by the patterned photoresist layer. The area under doped region 310 is therefore exposed. Lastly, the patterned photoresist layer is removed. It is noted that the previous embodiment shows that the doped region 310 and the liner layer 312 are formed first (FIG. 3), and then the liner layer 312 in the second opening 308 and the third opening 309 is removed (FIG. 4). However, in another embodiment, the liner layer 312 is formed, and then the liner layer 312 in the second opening 308 and the third opening 309 is removed. Lastly, the doped region 310 is formed.

Figure 5:
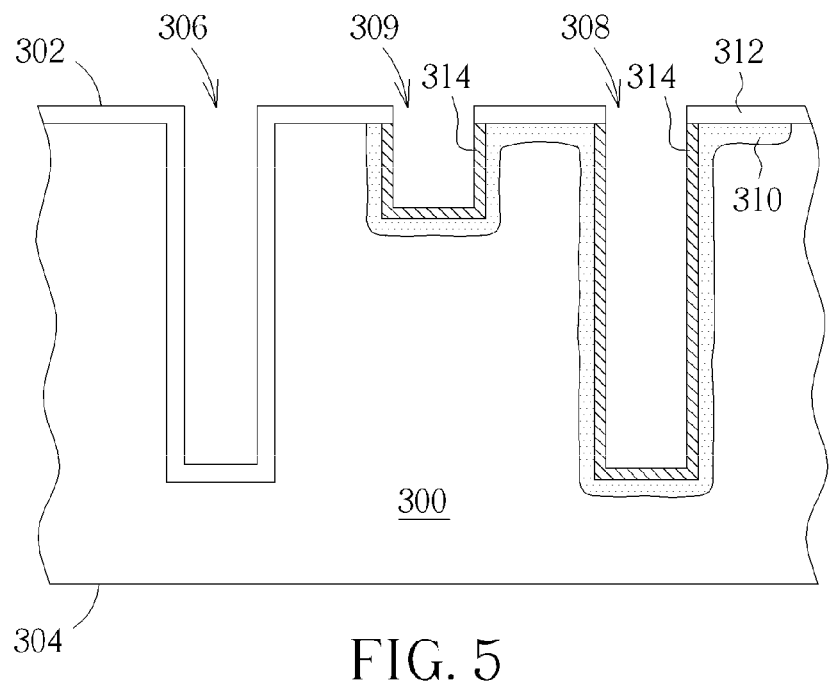

As shown in FIG. 5, an ultra-thin dielectric layer 314, such as a single oxide layer, a single nitride layer or multi layers with an oxide layer and a nitride layer, is formed on the surface of the second opening 308 and the third opening 309. The dielectric layer 314 can be formed through a thermal oxidation process. Preferably, the thickness of the dielectric layer 314 is smaller than that of the liner layer 312. For instance, the thickness of the dielectric layer 314 is from 40 Å to 100 Å. Since the dielectric layer 314 is formed through a thermal oxidation process, it is preferably only formed on the surface of the second opening 308 and the third opening 309. In one embodiment, after forming the dielectric layer 314, a cap layer (not shown) can be optionally formed on the substrate 300 to at least cover the surface of the second opening 308 and the third opening 309. Preferably, the cap layer may be a silicon nitride layer and has a thickness smaller than that of the dielectric layer 314. Alternatively, the capping layer can form an ONO structure with the dielectric layer 314.

Figure 6:
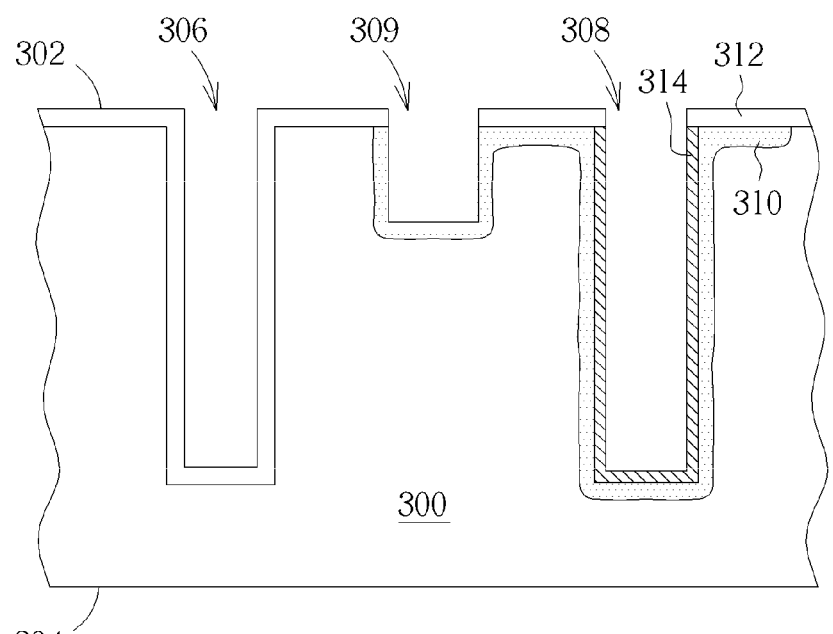

As shown in FIG. 6, the dielectric layer 314 (and the cap layer) is removed from the third opening 309. In one embodiment, a patterned photoresist layer (not shown) is formed on the substrate to cover the region outside the third opening 309, and then a wet etching and/or a dry etching is performed to remove the dielectric layer 314 not covered by the patterned photoresist layer. The area under the doped region 310 is therefore exposed. Finally, the patterned photoresist layer is removed.

Figure 7:
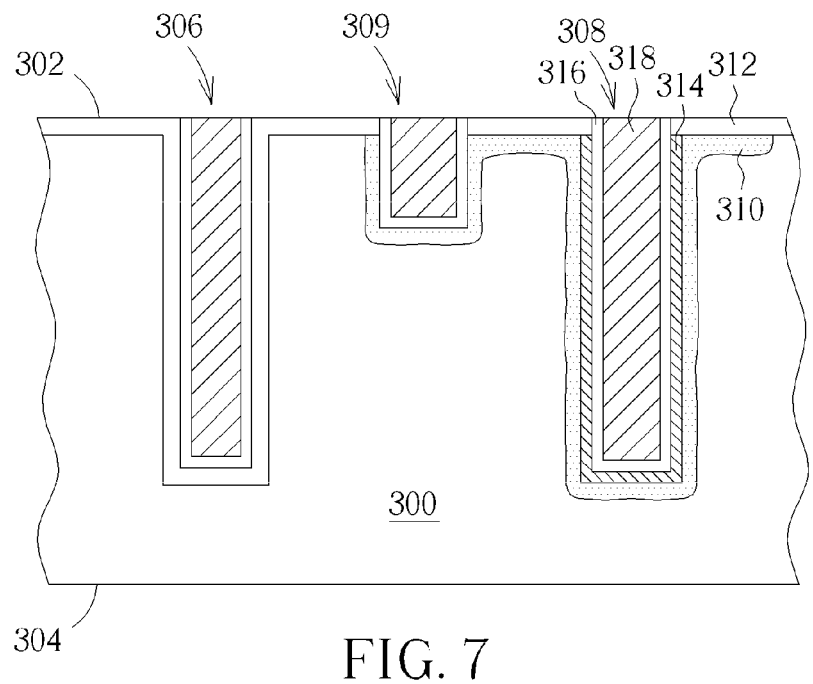

As shown in FIG. 7, an optional barrier layer 316 and a conductive layer 318 are sequentially formed on the surface of the first opening 306, the second opening 308 and the third opening 309. Preferably, the conductive layer 318 completely fills the first opening 306, the second opening 308 and the third opening 309. In one embodiment, the barrier layer 316 is formed through a physical vapor deposition (PVD) process and is made of TiN, and the conductive layer 318 is formed through an electroplating process and is made of copper. In one embodiment, after forming the barrier layer, a copper seeding layer (not shown) is formed, following by the electroplating process. Lastly, a planarization process, such as a chemical mechanical polish (CMP) process and/or an etching back process, is performed to remove the barrier layer 316 and the conductive layer 318 above the liner 312 layer. In another embodiment, the liner layer 312 above the substrate 300 can be further removed.

Figure 8:
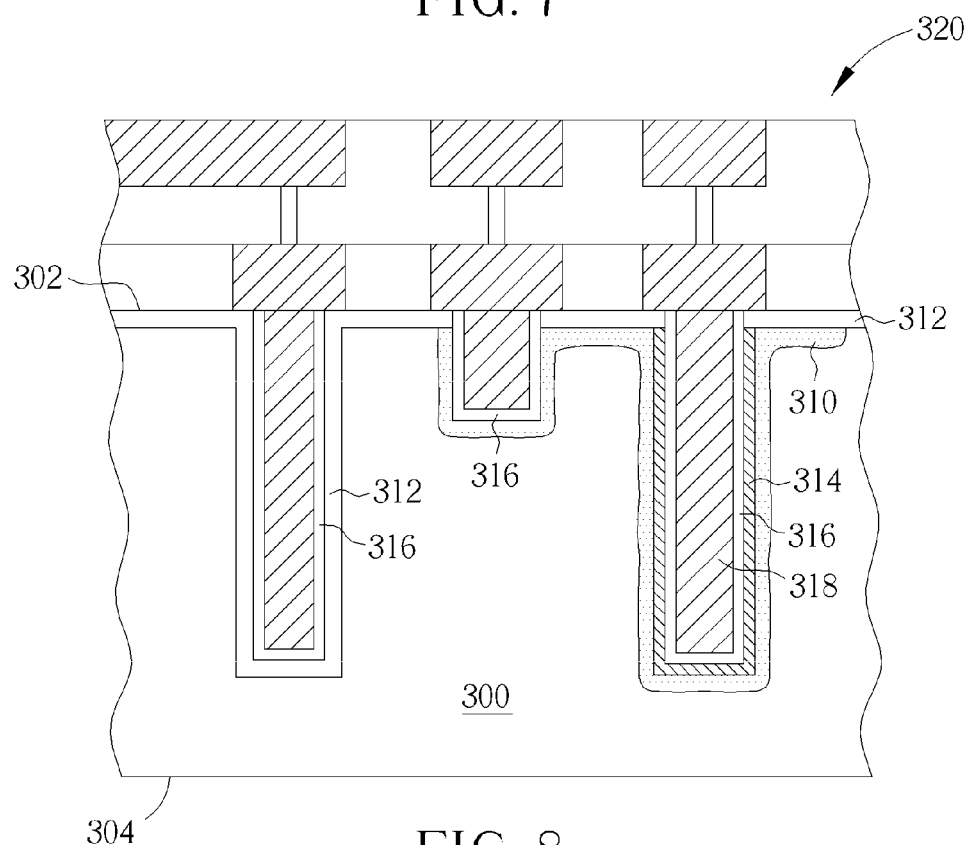

As shown in FIG. 8, a metal interconnection system 320 is formed on the substrate 300 at the side of the first surface 302. The metal interconnection system 320, for example, can include a plurality of metal layers and a plurality of dielectric layers. In one embodiment, the metal interconnection system 320 respectively connect the conductive layer 318 in the first opening 306, the second opening 308 and the third opening 309 so as to transmit input/output electrical signals.

Figure 9:
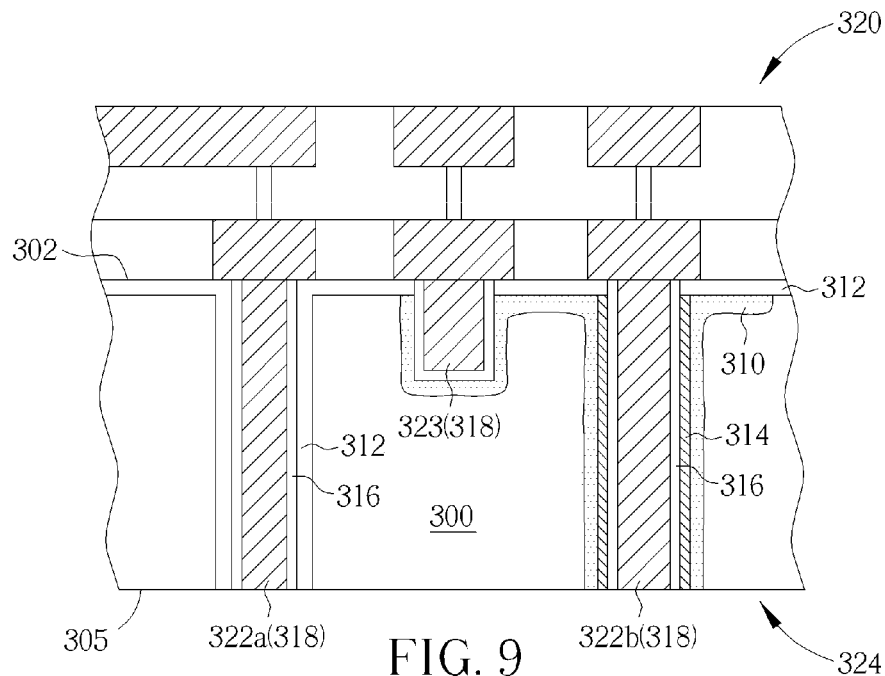

As shown in FIG. 9, the substrate 300 is subjected to a thinning process from a side of the second surface 304. The thinning process is carried out until the conductive layer 318 (or the barrier layer 316) in the first opening 306 and the second opening 308 is exposed. At this time, the second surface 304 of the substrate 304 becomes the third surface 305. By doing this, a TSV (through silicon via) 322a is formed in the left side in FIG. 9, and the capacitor structure 324 in the present invention is formed in the middle and the right side in FIG. 9, wherein the conductive layer 318 in the second opening 308 becomes a TSV 322b, and the conductive layer 318 in the third opening 309 becomes a pick up structure 323.

Figure 10:
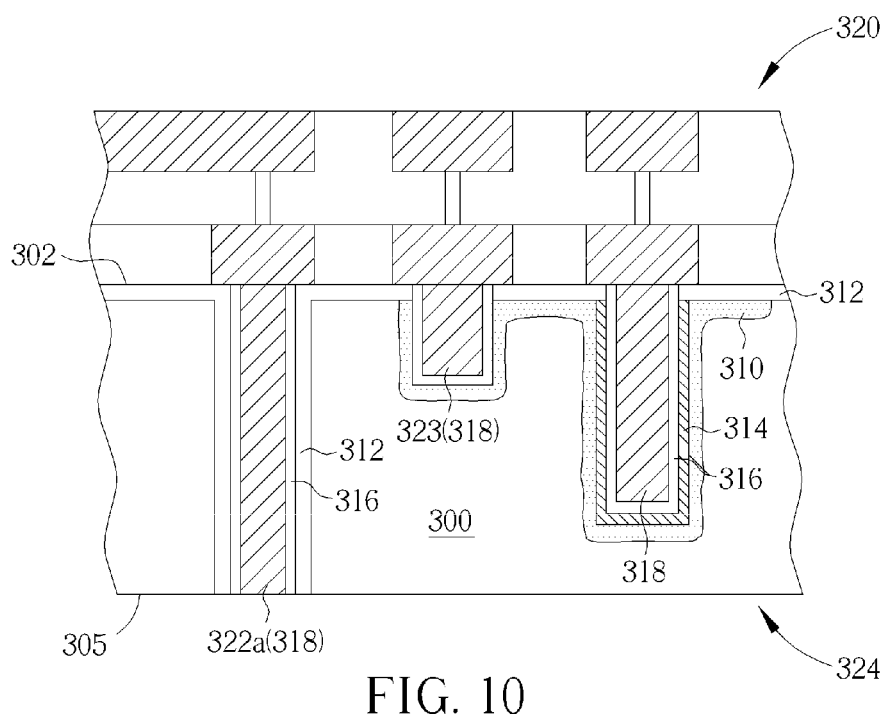
FIG. 10 shows a schematic diagram of the method of forming the capacitor structure according to another embodiment of the present invention.

It is noted that if the depth of the first opening 306 is different from that of the second opening 308, it is preferable to at least expose the conductive layer 318 in the first opening 306. Please refer to FIG. 10, which shows a schematic diagram of the method of forming the capacitor structure according to another embodiment of the present invention. As shown in FIG. 10, when the depth of the first opening 306 is greater that of the second opening 308, the thinning process is carried out until the conductive layer 318 in the first opening 306 is exposed. At this time, the conductive layer 318 in the second opening 308 is not yet exposed. In one preferred embodiment, the thinning process keeps going until both of the conductive layer 318 in the first opening 306 and the second opening 308 is exposed. Similarly, a TSV 322a is formed in the left side in FIG. 10, and the capacitor structure 324 in the present invention is formed in the middle and the right side in FIG. 10, wherein the conductive layer 318 in the second opening 308 becomes one electrode of the capacitor structure 324, and the conductive layer 318 in the third opening 309 becomes a pick up structure 323.

As shown in FIG. 9, the capacitor structure 324 in the present invention includes the substrate 300, the TSV 322b, the dielectric layer 314 and the doped region 310. The substrate 300 has a first surface 302 and a third surface 305. The TSV 322b penetrates through the first surface 302 and the third surface 305 of the substrate 300. The dielectric layer 314 is disposed between the substrate 300 and the TSV 332b and preferably encompasses the sidewalls of the TSV 322b. The doped region 310 is disposed in the substrate 300, contiguous to and between the pick up structure 323 and the TSV 322b, and preferably encompasses the dielectric layer 314. When applying appropriate signal through the metal interconnection system 320, the TSV 322b can serve as the first electrode of the capacitor structure 324, and the doped region 310 can serve as the second electrode of the capacitor structure 324, in which the ultra-thin dielectric layer 314 is disposed therebetween, thereby forming a "metal-insulation-metal" structure. Besides, the TSV 322a is disposed in the substrate 300 and the TSV 322a penetrates through the first surface 302 and the third surface 305. The liner layer 312 encompasses the TSV 322a but not the TSV 322b of the capacitor structure 324. The doped region 310 preferably does not encompass the TSV 322a.

In addition, as shown in FIG. 10, there is another embodiment that the depth of the first opening 306 is greater than that of the second opening 308. That is, the depth of the TSV 322a is greater than that of the electrode of the capacitor structure 324. In this embodiment, a larger capacitance value is further obtained due to the region between the doping region 310 and the conductive layer 318 at the bottom of the second opening 308.

In the present invention, the TSV is used as the electrode of the capacitor structure, so the area between the electrode and the dielectric layer can be enlarged and the capacitance can be improved as well. In one embodiment, when the depth of the second opening 308 is about 100 μm and the width of the dielectric layer 314 is about 100 Å, the capacitance value of the capacitance structure 324 can reach to about 50 $fF/\mu m^2$, which is much greater than that of conventional capacitor structure formed in metal inter-dielectric layers (MID) (about 2 $fF/\mu m^2$).

In summary, the capacitor structure and the forming method thereof is based on a conventional TSV structure. When forming the conventional TSV, the capacitor can be formed simultaneously. The forming method can be applied with a "TSV first" process, a "TSV last" process, or even a "TSV middle" process according to the time-point of forming the metal interconnection system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor structure, comprising:
   a substrate with a first surface and a second surface which are disposed oppositely to each other;
   a through silicon via (TSV) disposed in the substrate, wherein the TSV penetrates through the first surface and the second surface of the substrate;
   a dielectric layer disposed in the substrate, wherein the dielectric encompasses the TSV;
   a doped region disposed between the dielectric layer and the substrate, wherein the TSV serves as a first electrode of the capacitor structure and the doped region serves as a second electrode of the capacitor structure.

2. The capacitor structure in claim 1, further comprising a pick up structure disposed on the substrate at the side of the first surface, wherein the pick up structure electrically connects the doped region.

3. The capacitor structure in claim 2, wherein the doped region is disposed in the substrate, contiguous to and between the pick up structure and the TSV.

4. The capacitor structure in claim 2, further comprising a metal interconnection system electrically respectively connected to the pick up structure and the TSV.

5. The capacitor structure in claim 1, wherein the substrate further comprises:
   a second TSV, penetrating through the first surface and the second surface; and
   a liner layer, encompassing the second TSV but not the TSV of the capacitor structure.

6. The capacitor structure in claim 5, wherein the doped region does not encompass the second TSV.

7. The capacitor structure in claim 5, wherein the thickness of the dielectric layer is smaller than that of the liner layer.

8. The capacitor structure in claim 1, wherein the doped region encompasses the dielectric layer and the TSV.

* * * * *